United States Patent
Hamada et al.

(10) Patent No.: US 10,712,658 B2
(45) Date of Patent: Jul. 14, 2020

(54) METHOD OF PROCURING AN AGGLUTINANT STRUCTURE AND A METHOD OF MANUFACTURING A PELLICLE INCLUDING SAID AGGLUTINANT PROCURING METHOD

(71) Applicant: SHIN-ETSU CHEMICAL CO., LTD., Chiyoda-ku (JP)

(72) Inventors: Yuichi Hamada, Takasaki (JP); Yu Yanase, Takasaki (JP)

(73) Assignee: SHIN-ETSU CHEMICAL CO., LTD., Chiyoda-ku (JP)

( * ) Notice: Subject to any disclaimer, the term of this patent is extended or adjusted under 35 U.S.C. 154(b) by 204 days.

(21) Appl. No.: 15/878,460

(22) Filed: Jan. 24, 2018

(65) Prior Publication Data

US 2018/0210333 A1    Jul. 26, 2018

(30) Foreign Application Priority Data

Jan. 24, 2017   (JP) ................................. 2017-010200

(51) Int. Cl.
 *G03F 1/64*    (2012.01)
 *C09J 133/04*  (2006.01)
(52) U.S. Cl.
 CPC .............. *G03F 1/64* (2013.01); *C09J 133/04* (2013.01)

(58) Field of Classification Search
 CPC .................................. G03F 1/64; C09J 133/04
 USPC ............................................................. 430/5
 See application file for complete search history.

(56) References Cited

FOREIGN PATENT DOCUMENTS

| JP | 2013-015710 A | 1/2013 |
| JP | 2014-065810   | 4/2014 |

OTHER PUBLICATIONS

Office Action dated Sep. 30, 2019, in Japanese Patent Application No. 2017-010200 (with English translation).

*Primary Examiner* — Christopher G Young
(74) *Attorney, Agent, or Firm* — Oblon, McClelland, Maier & Neustadt, L.L.P.

(57) ABSTRACT

There is provided a method for procuring an agglutinant structure or in particular an agglutinant layer, from an agglutinant material, which is laid on an end face of a pellicle frame for gluing the pellicle to a photomask, wherein the agglutinant material is processed into the agglutinant layer passing through one more stages wherein the material is under a helium gas atmosphere; the invention is also about a manufacturing method of a pellicle wherein the agglutinant layer is procured in the above described manner.

20 Claims, 3 Drawing Sheets

METHOD OF PROCURING AN AGGLUTINANT STRUCTURE AND A METHOD OF MANUFACTURING A PELLICLE INCLUDING SAID AGGLUTINANT PROCURING METHOD

The present non-provisional patent application claims priority, as per Paris Convention, from Japanese Patent Application No. 2017-10200 filed on 2017 Jan. 24, the disclosure of which is hereby incorporated by reference herein in its entirety.

FIELD OF THE INVENTION

The present invention relates to a method of procuring an agglutinant structure and a method of manufacturing a pellicle including the step of procuring the same agglutinant structure as the pellicle's agglutinant layer.

BACKGROUND OF TECHNOLOGY

In the photolithography technology, a process of making a semiconductor device or a liquid crystal display includes a step at which a pattern is formed by irradiating light onto a semiconductor wafer or an original plate (for liquid crystal) coated with resist; if, however, a foreign matter is adhered to the lithography mask or the reticle used on this occasion (hereinafter collectively referred to as "photomask"), this foreign matter absorbs light or bends light, whereby the transferred pattern becomes deformed or the edges become coarse, and the base becomes dirty black with the resulting problems of impaired size, quality, appearance and the like.

Though this process is usually performed in a clean room, it is still difficult to keep the exposure original plate clean at all times; therefore, in general, a means called pellicle for fending off foreign matters is installed on the exposure original plate before the exposure is conducted.

The pellicle is generally composed of a rectangular pellicle frame, a pellicle film attached in a slack-free manner to an upper end face of the pellicle frame, an airtight gasket formed on a lower end face of the pellicle frame, as well as other minor parts. The pellicle film exhibits a high transmittance with respect to an exposure light; and the said airtight gasket, generally made of an adhesive, is meant to glue the pellicle to the photomask, hence called an agglutinant.

If such a pellicle is installed on the photomask, the foreign matters do not directly adhere to the photomask for they are intercepted by and caught on the pellicle. Then, in the photolithography step, if the focal point is aligned with the pattern described on the photomask, the foreign matters on the pellicle are off the focal point and hence their images are not transferred, and thus the problems such as deformation of the pattern can be solved.

Now, in the photolithography technology, with the densification of patterns, shortening of the wavelength of the exposure light source has been progressed as a measure for increasing the resolution. To date, the exposure light source has shifted from g-line (436 nm) and i-line (365 nm) by mercury lamp to KrF excimer laser (248 nm) and ArF excimer laser (193 nm), and furthermore, the use of EUV (Extreme Ultra Violet) light with a dominant wavelength of 13.5 nm is also being studied.

On the other hand, with the furthering of the densification of the pattern, the agglutinant for gluing the pellicle to the photomask is being required to have scarce shortcomings and higher reliability, while up until now it could pass inspections if only it could glue the pellicle to the photomask even when it contained more or less air bubbles in it. However, if such bubbles are mixed in the agglutinant layer, which is laid and shaped on the lower end face of the pellicle frame, problems such as inadequate adhesion occur when the pellicle is glued to the photomask.

Therefore, IP Document 1 teaches to form a coating layer of a silicone resin over the pellicle frame surface as a measure to prevent the air captured in pits, cavities or holes in the surface of the pellicle frame from entering and forming small air bubbles in the agglutinant layer. However, this measure has a problem in that the manufacturing cost is increased due to the added process of creating such coating layer.

Furthermore, recently, with the increasing densification of the patterns, the deformation of the photomask which is caused when the pellicle is glued to the photomask has become one of the major problems. In order to suppress such type of deformation of the photomask, the agglutinant layer is being demanded to have higher uniformity in quality than before and is no longer permitted to contain fine air or gas bubbles, while at the same time it is required to maintain minimum necessary adhesive strength.

PRIOR ART PUBLICATION

IP Publication

Japanese Patent Application Publication No. 2013-15710

SUMMARY OF THE INVENTION

Problems the Invention Seeks to Solve

To cope with such a requirement, it is possible to exclude from a manufacturing line a pellicle found to have air bubbles mixed in the agglutinant layer as a defective item at an agglutinant quality inspection step, but this is not preferable because the yield of the line is lowered.

In view of the above circumstances, it is therefore an object of the present invention to provide a method of procuring an agglutinant structure and a method of manufacturing a pellicle using the same agglutinant structure as its agglutinant layer in it, whereby little air bubble contamination occurs in the agglutinant layer of the pellicle.

Means to Solve the Problems

The inventors of the present invention conducted intensive studies to achieve the above objects, and as a result, they focused their attention on the fact that, since a helium molecule is one of the smallest in size among the molecules of gases that constitute the air such as nitrogen gas (the air being the typical atmosphere wherein agglutinant layer is created conventionally), the helium gas has a higher defoaming characteristic, and they found that if the agglutinant that has been prepared in a helium gas atmosphere is used to make the agglutinant layer, the thus made agglutinant layer becomes less liable to be contaminated with air or gas bubbles—hence they possessed the present invention.

Therefore, the present invention is characteristic in that the procurement of the agglutinant structure is carried out using an adhesive prepared under a helium gas atmosphere. It is preferable that this procurement process includes one or more of the steps of storing or preserving, pressurizing, stirring, and de-foaming.

Further, the present invention provides a method for manufacturing a pellicle which includes a step of procuring an agglutinant structure under a helium gas atmosphere as the agglutinant layer formed on the pellicle frame's lower end face for gluing the pellicle to a photomask.

Effect of the Invention

According to the present invention, absorption or mixing of air bubbles into the agglutinant layer can be suppressed, and thus such an agglutinant layer procuring method is useful particularly for applications requiring high accuracy. In addition, since it is possible to produce at a high yield a pellicle with little air bubble contamination in its agglutinant layer, the manufacturing cost can be maintained low and the stable supply is secured so that such a pellicle can be suitably used in the manufacture of semiconductor devices or the like which are required to have high reliability in quality and supply.

EMBODIMENTS FOR CARRYING OUT THE INVENTION

Figure 1:
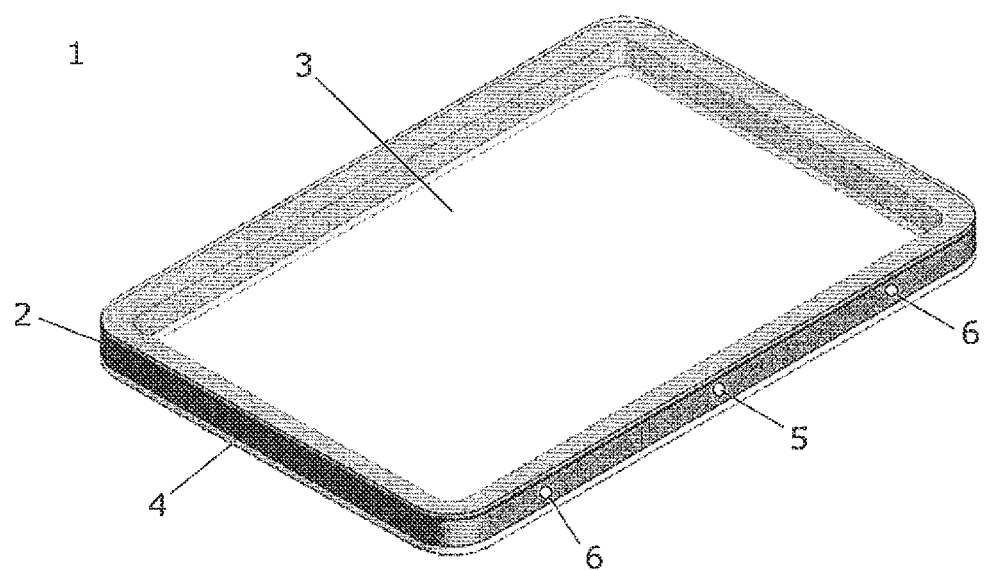
FIG. 1 A perspective view schematically showing the structure of a typical conventional pellicle.

In the agglutinant structure procuring method of the present invention, the kind of the adhesive to make the agglutinant structure is not particularly limited. Choice may be made, depending on the application, from a rubber type adhesive, an acrylic type adhesive, a silicone type adhesive, a urethane type adhesive or the like. If the application is for pellicle, an acrylic adhesive or a silicone adhesive excellent in heat resistance, light resistance and the like can be suitably used. Also, it is preferable that the selected material releases less outgas which causes haze.

The shape and the type of curing method for the agglutinant (adhesive) are also not particularly limited, and the material of the agglutinant may be selected, depending on the application, from a solvent type adhesive, an emulsion type adhesive, an ultraviolet curable adhesive, a two-liquid mixed type curing adhesive or the like.

The method of procuring the agglutinant structure of the present invention includes steps of: forming an agglutinant into a desired shape on a surface of a structure such as pellicle frame and curing it to harden, and the method is characteristic in that the agglutinant used is an adhesive material which has been prepared under a helium gas atmosphere. In this preparation stage, it is preferable that the agglutinant in a liquid state is stored, pressurized, stirred or de-foamed under a helium gas atmosphere, and it is also preferable that a main agent or a main agent and a curing agent are respectively stirred under a helium gas atmosphere. In addition, it is preferable to perform degassing (de-foaming) by subjecting the agglutinant to centrifugal separation treatment under a helium gas atmosphere.

Therefore, in the agglutinant structure procuring method of the present invention, the agglutinant is preferably preserved in a helium gas atmosphere throughout the process until the agglutinant is molded and cured to have a desired shape. And particularly at such stages where contamination with air bubbles is more liable to occur such as pressurizing stage, pressure filtration stage, and stirring stage, it is preferable to conduct these under a helium gas atmosphere; also, the agglutinant after its preparation may be stored in a helium gas atmosphere. By shaping and curing thus prepared agglutinant, it is possible to obtain an agglutinant structure which is not liable to be contaminated with air bubbles.

It is considered that such effect is obtained due to the fact that, although helium gas enters in the structure during the preparation stages such as pressurizing, pressure filtering or stirring, the size of the helium molecule is so much smaller than most of the other molecules found in the atmosphere such as nitrogen molecule that the helium gas is more liable to be degassed than most of the other gases that are in the atmosphere, under which agglutinant was conventionally prepared, and thus the helium gas is de-foamed in the subsequent shaping and curing steps.

Therefore, performing the above preparation operations under a helium gas atmosphere gives rise to a particularly favorable result. In addition, it is thought that if works other than the above operations are also performed under a helium gas atmosphere it is possible to further suppress the contamination of the agglutinant structure with gas bubbles.

The pressurizing operation of the present invention is an operation of applying a pressure equal to or higher than atmospheric pressure (1 atm) to an agglutinant, and it is possible to pressurize the inside of a container containing the agglutinant and a helium gas atmosphere at the time of, for example, storing/stocking. In addition, it is possible to adopt a helium gas atmosphere for pressurized filtration step.

In the stirring operation of the present invention, when the agglutinant is composed of a main agent and a curing agent, for example, it is preferable to carry out the mixing of them under a helium gas atmosphere; but also it is effective to conduct the mixing in a helium gas atmosphere even when the agglutinant consists of a main agent only. Even in the cases of other stirring operations that are conducted to answer different demands, it is equally preferable to employ a helium gas atmosphere.

Furthermore, in the agglutinant structure procuring method of the present invention, it is preferable to perform a centrifugal separation operation, by which it is possible to effectively separate the gas from the agglutinant.

In the agglutinant structure procuring method of the present invention, it is possible to obtain shaped agglutinant structures with little air bubble contamination by using an agglutinant prepared in the manner as described above and then by molding and curing them. As for the method of curing the agglutinant, it is selected depending on the type of the agglutinant used.

Further, in the method of procuring the agglutinant structure of the present invention, gas bubbles are hardly mixed into the procured agglutinant structures, so that it is particularly effective for use in manufacturing a pellicle which does not induce a distortion in a photomask when the pellicle is glued to the photomask.

The thickness of the agglutinant layer of the pellicle is generally set to 200 to 500 µm, which is greater than that of the adhesive tape or the like. When the thickness of an agglutinant structure is small, gas bubbles are relatively unlikely to be generated; also, it becomes difficult to remove air bubbles if the thickness of an agglutinant layer is relatively large, as in the case of the agglutinant layer of a pellicle. In these circumstances, the agglutinant layer of the pellicle for the application of manufacturing semiconductor device or the like are strictly required to have scarce defects and high reliability; hence the agglutinant structure procuring method according to the present invention is especially profitable to the manufacturers of the pellicles for semiconductor devices.

In the manufacturing method of the pellicle of the present invention, the agglutinant is shaped on one of the end faces of the pellicle frame in accordance with the agglutinant structure procuring method of the present invention. In this agglutinant structure procuring method, the agglutinant layer for gluing the pellicle to the photomask is laid typically by continuously dispensing liquid agglutinant on the lower annular end face of the pellicle frame endlessly, and molding the thus laid agglutinant in such a manner that the cross-section of the resulting agglutinant layer has a quadrangular shape or a semicircular shape.

Further, on the exposed face of the molded and cured agglutinant layer, a separator, which is a 50 to 300-μm-thick PET film or the like film having a releasing property imparted to one of its faces, may be provided. This film is for protecting the agglutinant layer, and may be omitted if a specially designed pellicle container or a special supporting means or the like for protecting the agglutinant layer is adopted.

In addition, an adhesive may be provided on the inner circumferential surface of the pellicle frame or on the inner surface of a later-described ventilation hole bored through a pellicle frame bar for the purpose of capturing and fixing floating foreign matters. In the case of this kind of embodiment also, it is preferable to shape the agglutinant layer by the method of the present invention.

The material of the pellicle frame used in the present invention is not particularly limited, and any known material can be used. Examples are: metals and alloys such as aluminum, aluminum alloy, steel, stainless steel, brass, invar, and super invar; engineering plastics such as polyethylene (PE) resin, polyamide (PA) resin, and polyether-etherketone (PEEK) resin; fiber composite materials such as glass fiber reinforced plastic (GFRP) and carbon fiber reinforced plastic (CFRP).

It is preferable that the surface of the pellicle frame is treated so as to be black, and, if necessary, a surface treatment such as coating may be applied to the surface of the pellicle frame for prevention of dust generation from the surface. For example, when the pellicle frame is made of an aluminum alloy, a surface treatment such as alumite treatment or a chemical conversion treatment is preferably performed, and if it is made of a steel, stainless steel or the like, a surface treatment such as black chromium plating is preferably performed.

Also, it is preferable to form a coating film of a non-tacky resin such as an acrylic resin and a fluorine-based resin on the inner peripheral surface of the pellicle frame or the entire surface thereof for the purpose of preventing dust generation from the surface. The formation of the film layer of these tacky or non-tacky resins can be carried out by a known method such as spraying, dipping, powder coating, and electrodeposition coating.

A plurality of jig holes or grooves may be provided on the outer peripheral face of the pellicle frame for purposes such as handling. Furthermore, marking of model number, serial number, bar code, etc. may be provided by mechanical engraving or laser burning.

Further, it is preferable to provide a ventilation hole for air pressure adjustment of the space which is defined between the pellicle and the photomask when they are glued together.

It is also preferable to install a filter made of a porous material such as polytetrafluoroethylene (PTFE) or the like in order to prevent foreign matters from entering the inner space through the ventilation hole.

This filter can be installed by a method such as bonding it to the outer peripheral face of the pellicle frame via an adhesive. Further, the shape, position and number of ventilation holes and filters may be determined in consideration of required air permeability and handling details to be performed.

The material for the pellicle film can be selected from most appropriate materials such as cellulose resin and fluorine-based resin, depending on the exposure light source to be used. Further, the film thickness may be appropriately determined from the viewpoints of transmittance, mechanical strength, etc., and an antireflection layer may be provided if necessary. In particular, when EUV light is used as the exposure light source, an extremely thin silicon film or graphene film having a thickness of 1 μm or less can be used.

Furthermore, the pellicle film can be adhered tensely to the upper end face of the pellicle frame via a known adhesive such as an acrylic adhesive, a fluorine-based adhesive, and a silicone adhesive.

EXAMPLES

Hereinafter, the present invention will be described in detail with reference to examples and comparative examples; however, the scope of the present invention is not limited to the examples.

Example 1

In Example 1, first, 5 kg of a curing agent mixing type acrylic agglutinant (SK-1425, manufactured by Soken Chemical & Engineering Co., Ltd.) was charged in a 10-litter pressure tank as a main agent of the agglutinant, and a cap was put to close the pressure tank, and under a helium gas atmosphere the pressure in the tank was increased to 4 times the atmospheric pressure to prepare the main agent of the agglutinant. Here, simultaneously as this preparation, a pressurized filtration was performed through a filter.

Then, the main agent of the agglutinant was let to sit for one hour under the helium gas atmosphere; thereafter, 20 g of the main agent of the agglutinant SK-1425 was collected from the pressure tank, and to this 0.1 g of a curing agent (L-45, manufactured by Soken Chemical & Engineering Co., Ltd.) was added and mixed for one minute with a metallic spatula to prepare the mixture, which was then de-foamed in a centrifugal separator. These operations from collecting the main agent of the agglutinant through the centrifugal separation treatment were all conducted in a glove box filled with helium gas.

Figure 2:
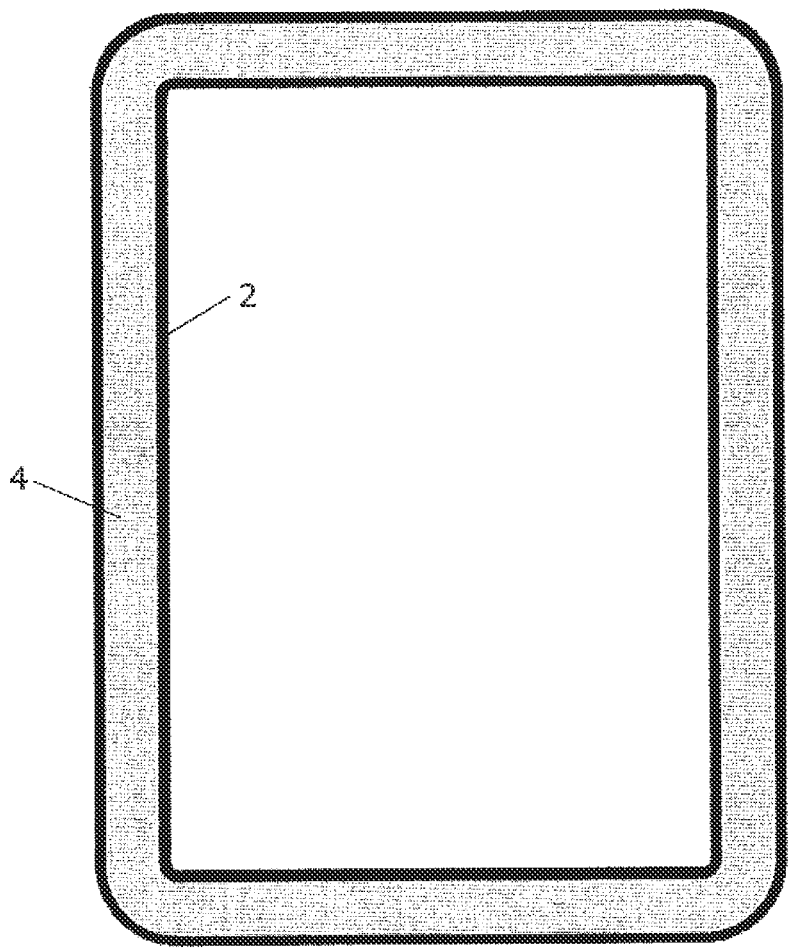
FIG. 2 A plan view schematically showing a pellicle frame 2 overlaid with an agglutinant layer 4.
Figures 3A, 3B:
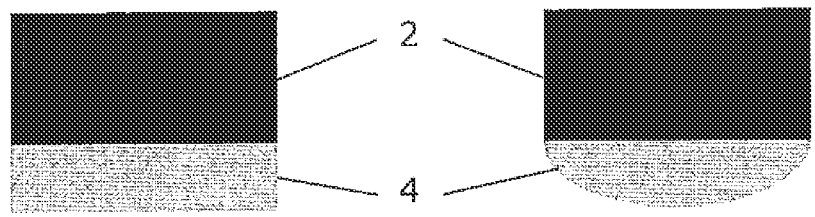
FIG. 3(a) A schematic view showing a cross section of an agglutinant layer 4 on a pellicle frame 2.
FIG. 3(b) A schematic view showing a cross section of an agglutinant layer 4 on a different pellicle frame 2.

Next, a pellicle frame made of an aluminum, of which the outer periphery measured 149 mm×115 mm×3.15 mm (in height) and the thickness 2 mm, and of which the surface was clad with a black alumite layer, was prepared. This pellicle frame was then subjected to a precision cleaning, and then the acrylic agglutinant as prepared in the above-described manner was laid on the lower end face of the pellicle frame by a dispenser to form an endless agglutinant layer extending throughout the entire circuit of the pellicle frame track, as shown in FIG. 2.

Also, after forming the agglutinant layer, it was cured by heating the pellicle frame to prompt a crosslinking reaction. Further, a pellicle film made of an amorphous fluororesin (CYTOP CTXS type, manufactured by Asahi Glass Company, Limited) was bonded to the upper end face of the pellicle frame via an amorphous fluororesin adhesive (CYTOP CTXA type, manufactured by Asahi Glass Company, Limited), whereby a pellicle of the present invention was completed.

In Example 1, a hundred pellicles were produced by this manufacturing method. Then, with respect to the 100 pellicles produced, their agglutinant layers were inspected, and no air bubbles were observed in any of them.

Example 2

In Example 2, except that SK-1495 (manufactured by Soken Chemical & Engineering Co., Ltd.) was used in place of the SK-1425 (manufactured by Soken Chemical & Engineering Co., Ltd.) as the curing agent mixing type acrylic agglutinant, an agglutinant layer was procured for each pellicle in the same manner as in Example 1 and a hundred pellicles were thus manufactured. Then, with respect to the 100 pellicles thus produced, their agglutinant layers were inspected, and no air bubbles were observed in any of them.

Example 3

In Example 3, except that a curing agent mixed type silicone agglutinant (KR-3700, manufactured by Shin-Etsu Chemical Co., Ltd.) was used as the agglutinant and that 0.2 g of PL-50T (manufactured by Shin-Etsu Chemical Co., Ltd.) was used as a curing agent, an agglutinant layer was procured in the same manner as in Example 1 on each pellicle, and one hundred pellicles were completed. Then, with respect to the 100 pellicles thus produced, their agglutinant layers were inspected, and no air bubbles were observed in any of them.

Comparative Example 1

In Comparative Example 1, an agglutinant layer was procured in the same manner as in Example 1 except that nitrogen gas was used in place of the helium gas, to prepare 100 pellicles. Then, with respect to the 100 pellicles thus produced, the agglutinant layers were inspected, and in five pellicles the agglutinant layer was found to contain one gas bubble.

Comparative Example 2

In Comparative Example 2, an agglutinant layer was procured in the same manner as in Example 1 except that air was used in place of the helium gas, to prepare 100 pellicles. Then, with respect to the 100 pellicles thus produced, the agglutinant layers were inspected, and in six pellicles the agglutinant layer was found to contain one gas bubble.

REPRESENTATION OF REFERENCE NUMERALS

1: pellicle
2: pellicle frame
3: pellicle film
4: agglutinant
5: ventilation hole
6: jig hole

What is claimed is:

1. A method of procuring an agglutinant structure, comprising:
    stirring an agglutinant material;
    de-foaming the agglutinant material; and
    forming the agglutinant material into the agglutinant structure in a helium gas atmosphere.

2. A method of procuring an agglutinant structure as claimed in claim 1, further comprising:
    preserving the agglutinant material in the helium gas atmosphere.

3. A method of procuring an agglutinant structure as claimed in claim 1, further comprising:
    applying a pressure equal to or higher than atmospheric pressure to the agglutinant material.

4. A method of procuring an agglutinant structure as claimed in claim 1, wherein the de-foaming comprises subjecting the agglutinant material to centrifugal separation.

5. A method of procuring an agglutinant structure as claimed in claim 1, wherein the stirring is conducted in the helium gas atmosphere.

6. A method of procuring an agglutinant structure as claimed in claim 1, wherein the de-foaming is conducted in the helium gas atmosphere.

7. A method of manufacturing a pellicle, comprising:
    preparing an agglutinant material in a helium gas atmosphere; and
    forming the agglutinant material into an agglutinant layer on a pellicle frame of the pellicle to manufacture the pellicle.

8. A method of manufacturing a pellicle as claimed in claim 7, wherein the preparing includes
    preserving the agglutinant material in the helium gas atmosphere.

9. A method of manufacturing a pellicle as claimed in claim 7, wherein the preparing includes
    applying a pressure equal to or higher than atmospheric pressure to the agglutinant material.

10. A method of manufacturing a pellicle as claimed in claim 7, wherein the preparing includes stirring the agglutinant material.

11. A method of manufacturing a pellicle as claimed in claim 7, wherein the preparing includes de-foaming the agglutinant material.

12. A method of manufacturing a pellicle as claimed in claim 7, wherein the de-foaming comprises subjecting the agglutinant material to centrifugal separation.

13. A method of manufacturing a pellicle as claimed in claim 7, wherein the de-foaming comprises subjecting the agglutinant material to centrifugal separation under the helium gas atmosphere.

14. A method of manufacturing a pellicle as claimed in claim 7, wherein the agglutinant material is formed into the agglutinant layer having a thickness of 200 to 500 µm.

15. A method of manufacturing a pellicle as claimed in claim 12, wherein the agglutinant material is formed into the agglutinant layer having a thickness of 200 to 500 µm.

16. A method of manufacturing a pellicle as claimed in claim 13, wherein the agglutinant material is formed into the agglutinant layer having a thickness of 200 to 500 µm.

17. A method of manufacturing a pellicle as claimed in claim 9, wherein the pressure is applied to a container including the agglutinant material under the helium gas atmosphere.

18. A method of manufacturing a pellicle as claimed in claim 9, wherein the applying of the pressure comprises applying a pressure which is 4 times the atmospheric pressure inside of a container including the agglutinant material under the helium gas atmosphere.

19. A method of manufacturing a pellicle as claimed in claim 17, wherein the agglutinant material is formed into the agglutinant layer having a thickness of 200 to 500 μm.

20. A method of manufacturing a pellicle as claimed in claim 18, wherein the agglutinant material is formed into the agglutinant layer having a thickness of 200 to 500 μm.

* * * * *